United States Patent [19]

Yamamoto et al.

[11] Patent Number: 5,575,662
[45] Date of Patent: Nov. 19, 1996

[54] METHODS FOR CONNECTING FLEXIBLE CIRCUIT SUBSTRATES TO CONTACT OBJECTS AND STRUCTURES THEREOF

[75] Inventors: Yasuhiko Yamamoto; Isao Ohki; Junji Yoshida; Hideo Yamashita; Kazuo Ouchi; Masayuki Kaneto, all of Osaka, Japan

[73] Assignee: Nitto Denko Corporation, Osaka, Japan

[21] Appl. No.: 288,913

[22] Filed: Aug. 11, 1994

[30] Foreign Application Priority Data

Aug. 27, 1993 [JP] Japan .................................. 5-213146

[51] Int. Cl.⁶ .................................................. H01R 9/09
[52] U.S. Cl. ................................................ 439/67; 29/846
[58] Field of Search ...................... 439/67, 77; 29/830, 29/846

[56] References Cited

U.S. PATENT DOCUMENTS

| | | |
|---|---|---|
| 4,184,729 | 1/1980 | Parks et al. .................................. 439/67 |
| 4,453,795 | 6/1984 | Moulin ........................................ 439/67 |
| 4,948,374 | 8/1990 | Carter ......................................... 439/67 |
| 5,069,628 | 12/1991 | Crumly ....................................... 439/67 |
| 5,147,208 | 9/1992 | Bachler ....................................... 439/77 |
| 5,354,205 | 10/1994 | Feigenbaum et al. ..................... 439/67 |

*Primary Examiner*—Neil Abrams
*Assistant Examiner*—Barry Matthew L. Standig
*Attorney, Agent, or Firm*—Sughrue, Mion, Zinn, Macpeak & Seas

[57] ABSTRACT

A connecting method comprising laminating a flexible circuit substrate having a plurality of bump contacts with a contact object having a plurality of portions to be contacted such that the respective bump contacts face to the portions to be contacted at a joined surface, correspondingly each other to form a laminate, and applying pressure to the entire surface of the laminate in a compressing direction with pressurizing means provided so as to pinch the laminate in a laminating direction to contact the plural bump contacts mounted on the flexible circuit substrate with the plural portions to be contacted corresponding thereto mounted on the contact object, respectively.

6 Claims, 5 Drawing Sheets

TO EACH BUMP
CONTACT

METHODS FOR CONNECTING FLEXIBLE CIRCUIT SUBSTRATES TO CONTACT OBJECTS AND STRUCTURES THEREOF

FIELD OF THE INVENTION

The present invention relates to a suitable method for connecting a flexible circuit substrate to a contact object having a plurality of portions to be contacted, such as electronic parts and electronic circuits, and a structure thereof.

BACKGROUND OF THE INVENTION

With recent high integration of semiconductor elements and high density mounting of electronic parts on circuit substrates, the number of signal wiring units, connection terminals and electrodes on contact objects has increased, and the spacing therebetween has also become closer.

The electronic parts are usually checked with respect to their characteristics and qualities at every stage of their manufacturing process. For example, at a stage at which a number of LSIs are formed on a silicon wafer or at a stage at which they are parted (the substances at these stages are hereinafter referred to as "bare chips"), a probe is required which can make contact with minute inspection objects densely arranged in an about 4 to 15 mm square region, simultaneously at multiple points with high reliability.

Further, when the above-described bare chips are directly integrated into a product, or at a stage at which a substrate densely provided with a number of electronic parts is integrated into a product together with other circuit blocks, a connecting structure which enables them to connect to a number of densely arranged contact objects with high reliability is also required, as is the case with the inspections at the above-described stages.

A connecting structure using a flexible circuit substrate having projecting bump contacts on a surface thereof is known as a structure which can effect temporary contact or lasting connection to the above-described contact objects formed minutely and densely.

Figure 6:
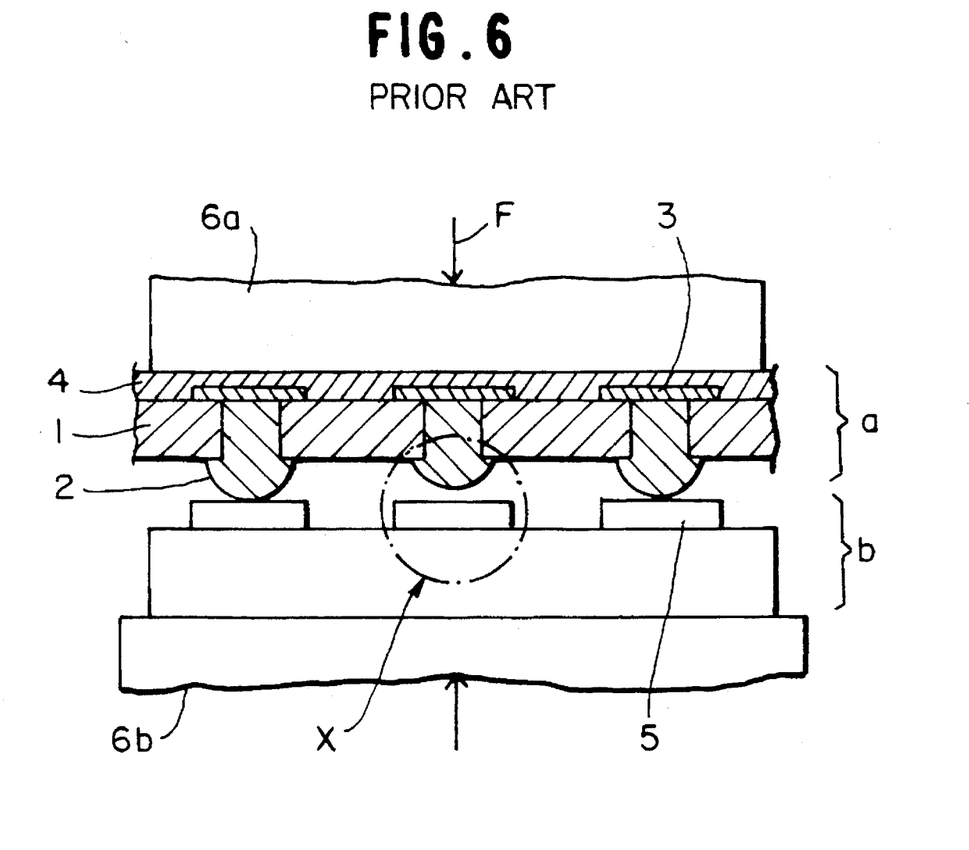
FIG. 6 is a partial sectional schematic view showing a conventional flexible circuit substrate and a connecting state thereof to a contact object.

FIG. 6 is a partial sectional schematic view showing a conventional flexible circuit substrate and a connected state thereof to a contact object. Referring to FIG. 6, a, is a conventional flexible circuit substrate in which a plurality of bump contacts 2 mounted on one surface of an electrically insulating film 1 are electrically connected to circuit patterns 3 provided on either surface of the film 1 or on an under layer of an electrically insulating protective film 4. The flexible circuit substrate $a_1$ is laminated with a contact object b such that a plurality of portions 5 to be contacted on the contact object b such as an electric part are contacted with the above-described bump contacts 2, corresponding to each other. Pressure F is applied to the entire surfaces of the laminate in a compressing direction from the respective opposite surfaces of pressurizing means 6a and 6b which are provided such that the laminate is pinched therebetween in a laminating direction. Thus, the portions 5 to be contacted are contacted with the bump contacts 2, corresponding to each other.

However, the height of the bump contacts themselves fluctuates by manufacturing errors, and in addition to this, the uniformities in the thickness of the electrically insulating film 1, the height of the portions 5 to be contacted on the contact object b, the flatness of a pressurizing surface of the pressurizing means 6a, and the parallelism between the pressurizing means 6a and 6b are all accumulated in the laminating direction. It is therefore very difficult to uniformly contact all the bump contacts 2 with the corresponding portions 5 to be contacted. In particular, as shown in a portion enclosed with an alternate long and short dash line X in FIG. 6, a failure to contact the bump contact 2 with the portion 5 to be contacted causes such a connecting structure to lose contact reliability, which raises a serious problem.

SUMMARY OF THE INVENTION

As a result of intensive studies to overcome the above-described problems, it has been found that elastic materials are mounted at positions corresponding to back sides of the respective bump contacts to absorb errors in thickness and the like accumulated in the laminating direction, and pressure is applied uniformly to the respective contact portions without localizing the pressure (contact pressure), whereby all the bump contacts can be simultaneously contacted with the corresponding portions. The present invention has been completed based on this finding.

Accordingly, an object of the present invention is to provide a contacting method which enables all bump contacts on a flexible circuit substrate to contact with corresponding portions on a contact object, the portions being formed minutely and densely.

Another object of the present invention is to provide a connecting structure having higher contact reliability.

DETAILED DESCRIPTION OF THE INVENTION

The connecting methods and the structures of the present invention are explained in detail below based on the accompanying drawings.

Figure 1A:
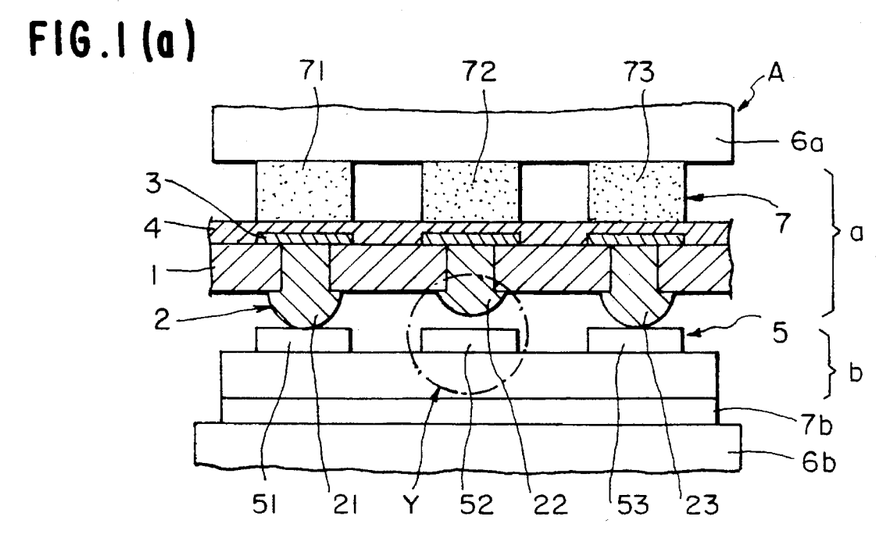
FIG. 1 is a schematic sectional view showing the structure of a flexible circuit substrate according to one example of the present invention.
Figure 1B:
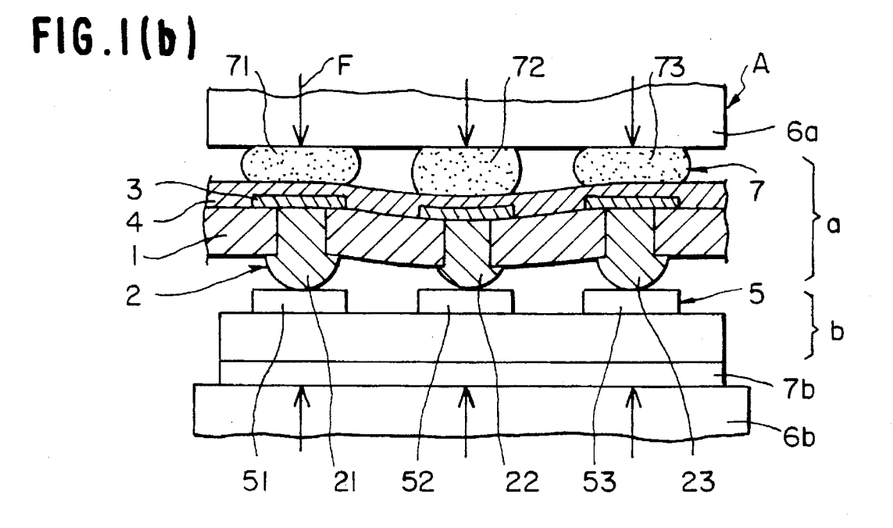

The present invention provides a connecting method comprising laminating a flexible circuit substrate a having a plurality of bump contacts 2 with a contact object b having a plurality of portions 5 to be contacted such that the respective bump contacts face the portions to be contacted at a joined surface, corresponding to each other to form a laminate, as shown in FIG. 1(a), and applying pressure F to the entire surface of the laminate in a compressing direction with pressurizing means 6a and 6b which are provided so as to pinch the laminate in a laminating direction to contact the plural bump contacts 2 mounted on the flexible circuit substrate a with the plural portions 5 to be contacted corresponding thereto mounted on the contact object b, respectively, as shown in FIG. 1(b).

It is preferred that the pressure applied to the laminate is uniformly distributed among respective combinations of the bump contacts and the corresponding portions to be contacted. However, under the existing circumstances, uniform distribution of the applied pressure can be relatively easily obtained by high-precision processing at levels of equipment such as inspection apparatus, but it is difficult to obtain such uniform distribution in case of minute contact objects or at levels of simple small-sized products such as card-like electric equipment.

To overcome this problem, the present inventors have developed suitable pressurizing means which can apply uniform pressure even if connection is conducted at any manufacturing levels. That is, as shown in FIG. 3, either of the pressurizing means 6a and 6b or both collectively receives pressure F applied from a pressurizing source 12 at a pressure carrier portion 10, and the pressure is dispersedly transmitted to the respective contacting portions of the bump contacts 2 and the portions 5 to be contacted through a transmitting portion 11.

The applied pressure can be diffused over all the contact combinations with this pressurizing means, resulting in a more desirable connecting method.

An elastic material may be mounted not only on the back side of the bump contact (designated by 7 in FIG. 1), but also on a position corresponding to the back side of the portion 5 to be contacted to the contact object b thereby intervening the elastic material between the portion 5 to be contacted and the pressurizing means 6b as designated by 7b in FIG. 1, thereby exerting an action similar to that exhibited by the elastic material 7 also on the portion to be contacted. Thus, a more desirable contact can be obtained.

The connecting method of the present invention exhibits the following function. That is, even if a combination which does not contact each other such as that of a bump contact 22 and a portion 52 to be contacted as denoted in a portion enclosed with an alternate long and short dash line Y in FIG. 1(a) is present in any position such as the margin or the central portion on the laminate, distribution of the uniform pressure to all the bumps strongly compresses the elastic materials 71 and 73 of contact combinations (for example, 21 and 51, and 23 and 53) around it as shown in FIG. 1(b) to absorb thickness errors accumulated in the laminating direction as described above. As a result, the combination which does not contact each other comes into contact, thus resulting in contacting all the bump contacts with the corresponding portions to be contacted.

The preferred connecting structures based on the connecting methods of the present invention are explained in detail by reference to the following examples. However, it is to be understood that the present invention is not intended to be limited to the examples.

EXAMPLES

FIG. 1 is a schematic sectional view showing a connecting structure of a flexible circuit substrate and a contact object according to one example of the present invention. In FIG. 1(a), A is a connecting structure of the present invention, which comprises a laminate prepared by laminating a flexible circuit substrate a with a contact object b such that a plurality of bump contacts 2 face to a plurality of portions 5 to be contacted at a jointed surface, corresponding to each other, and pressurizing means 6a and 6b which are provided so as to pinch the laminate in a laminating direction. As shown in FIG. 1 (b), pressure F is applied to the entire surface of the laminate from the pressurizing means 6a and 6b in a compressing direction to contact the bump contacts 2 with the portions 5 to be contacted.

The flexible circuit substrate a may have any structure so long as the plural bump contacts 2 mounted on one surface of an insulating film 1 are electrically connected to circuit patterns 3 provided on either surface of the film 1 or in the inside thereof, and an elastic material 7 is mounted at least on a position corresponding to the back side of the bump contact. For example, the bump contacts 2 on one surface of the electrically insulating film 1 are electrically connected to the circuit patterns 3 on the other surface in the inside of the film, or the bump contacts 2 and the circuit patterns 3 coexist on the same surface of the insulating film 1 and are electrically connected to each other on the surface.

Further, the electrically insulating film 1 may be laminated in multiple. For example, the electrically insulating film may have a structure such that the bump contacts are formed on both sides of a first layer thereof and are electrically connected each other (so-called anisotropic electrically conductive film), which is laminated with an electrically insulating film having the circuit patterns.

The shape of the bump contact is not always a projection, depending upon the shape of the corresponding portion to be contacted. For example, when the shape of the corresponding portion to be contacted is a projection, the bump contact may be shaped into a flat form, and further may be depressed from a surface of the substrate.

In these cases, each is not structurally distinguished from a flexible circuit substrate in which a plurality of circuit patterns laminated in multiple electrically connect beyond between layers, but such a substrate also belongs to the above-described substrate a. That is, the flexible circuit substrate a used in the present invention may have any structure so long as its substrate has a flexibility and a function of electrical connection to the contact objects on the surface.

There is no particular restriction on the electrically insulating film 1 so long as it has an electrically insulating property and film flexibility. Examples of the film having an appropriate flexibility include polyester resins, epoxy resins, urethane resins, polystyrene resins, polyethylene resins, polyamide resins, polyimide resins, ABS resins, polycarbonate resins, silicone resins and fluororesins, irrespective of thermosetting or thermoplastic resins.

Preferred examples of materials for the circuit patterns 3 include copper, nickel, solder, gold and silver. Methods for forming the circuit patterns 3 include a subtractive method and an additive method. The subtractive method is a method in which an insulating film is laminated with one to several electrically conductive layers through deposition or contact bonding, followed by etching to form circuit patterns. The additive method is a method in which circuit patterns are directly formed on an electrically insulating film through plating or deposition.

Materials for the bump contacts 2 used in the present invention include gold, silver, copper, nickel, tin, solder and various alloys containing these as main components. The bump contacts 2 are formed not only by a single metal alone, but also as multi-layer structures comprising several kinds of metals according to the state of the portions to be contacted or the conditions of use. For example, when the bump contacts are used as contacts to which pressure is repeatedly applied, or when they are needed to penetrate into the portions to be contacted, it is preferred to form multi-layer structures in which comparatively hard metals such as nickel are used as core metals for the bump contacts, and good electrically conductive metals such as gold and solder are used as surface metals.

Methods for forming the bump contacts 2 include a plating method such as an electrolytic plating or an electroless plating, a wire bonding method, and a cream solder potting method. of these methods, the plating method such as electrolytic plating is preferred from the standpoints of easy formation of minute projecting contacts and good processability.

The elastic materials 7 used in the present invention include those which utilize elastic deformation of materials themselves such as natural rubber, polymers and foamed products thereof, and those which have structures suitable for elastic displacement such as coiled springs. Those which utilize elastic deformation of materials themselves are particularly useful for minute connecting structures of highly close spacing.

The materials showing the elastic deformation as described above preferably generate less deterioration in elasticity with the passage of time against repeated compression when they are used in process inspections, and against static load when they are lastingly incorporated into products, respectively. Examples of such materials include elastomers and films of butadiene, nitrile, acrylic, ethylenepropylene, butyl, fluoro, silicone, styrene, urethane, ester, vinyl, olefin, amide, and imide, in addition to natural rubber. With technical progress, they may be replaced by novel elastic materials.

There is no particular restriction on the shape of the elastic materials 7 so long as they are mounted at least on positions corresponding to the back sides of the bump contacts of the substrate a. Examples thereof are shown in FIG. 1(a) and FIGS. 2(a) to 2(C).

The embodiment shown in FIG. 1(a) is an example in which the elastic materials 7 are formed separately and irrelevantly to one another in positions corresponding to the back sides of the respective bump contacts of the substrate. Examples of the individual shapes of the elastic materials 7 include pillars, cones, pyramids, frustums, spindles, complexes thereof and cylindrical bodies thereof each having a cross section vertical to the compressing direction such as a circle, an ellipse, a polygon and various modified shapes. For each of these, various parameters such as the cross-sectional area and the natural length can be selected.

Figure 2A:
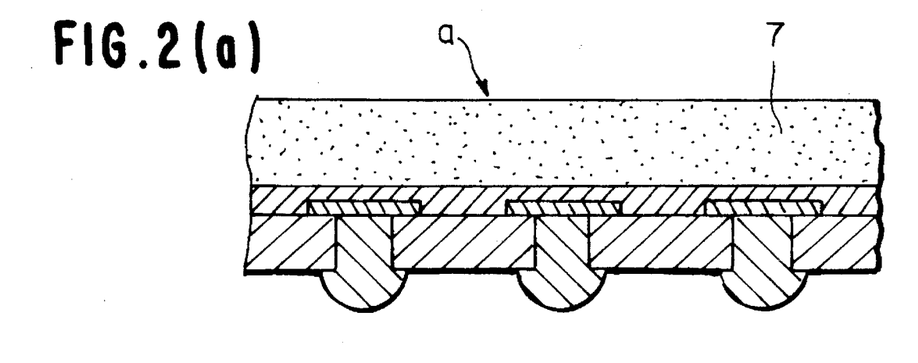
FIG. 2 is a schematic sectional view showing the specific embodiments of elastic materials.

The embodiment shown in FIG. 2(a) is an example in which the elastic material 7 is formed in a plate form. This is one of the preferred embodiments for practical use because of its low manufacturing cost and easy arrangement on the substrate. The plate may be composed of a single material or may further be a laminate comprising a plurality of elastic materials. The laminate may partially contain a layer of a material showing elastic deformation. Further, the plate is freely provided with various penetration holes or concavities in predetermined positions thereof to give changes to the thickness of the layer.

Figure 2B:
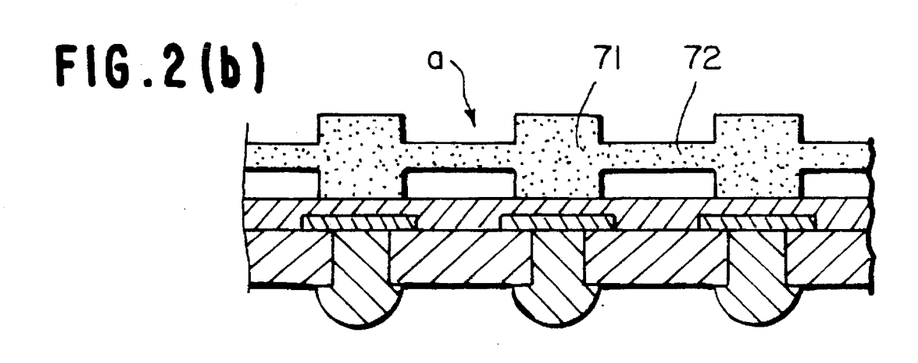

FIG. 2(b) is a sectional view showing an example in which the embodiments shown in FIG. 1(a) and FIG. 2(a) are combined. Elastic materials 71 formed individually in the positions corresponding to the back sides of the respective bump contacts of the substrate are constitutionally integrated with plate-like elastic materials 72. Such constitution offers both advantages of good independent compressibility of the elastic materials individually formed on the respective bump contacts, low cost of the plate-like elastic materials and easy arrangement on the substrate.

Figure 2C:
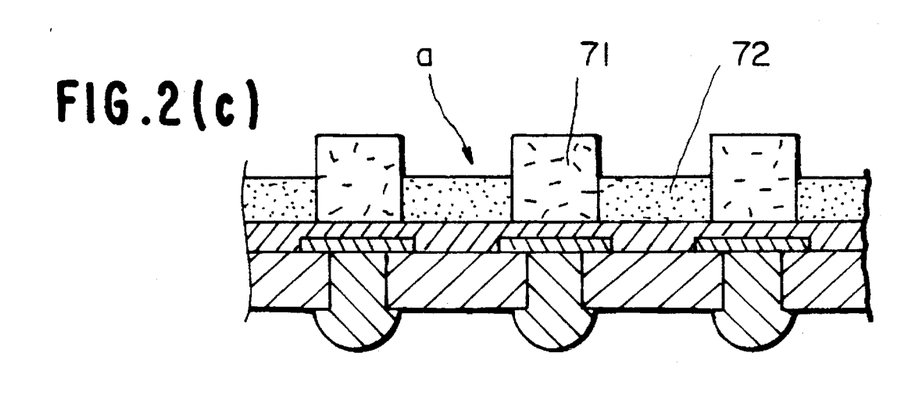

FIG. 2(c) is a sectional view showing an example in which plate-like portions 72 and projecting portions 71 are formed of different elastic materials. Such a combination makes it possible to distribute an arbitrary load in an arbitrary position. The projecting portions 71 may be minutely subdivided and each formed of different elastic materials, depending upon the purpose. The thickness of the plate-like portions 72 in the above-described embodiments may be freely set. For example, it can be set to the same thickness as that of the projecting portions 71.

Methods for forming the elastic materials are largely divided into methods for directly forming the elastic materials on the substrates and methods for separately forming the elastic materials, and joining the same to the substrates.

Useful examples of the methods for directly forming the elastic materials on the substrates include methods of applying precursor solutions or solutions of polymers to the substrates and drying them, methods of forming by the use of molds and various film forming methods which may be subjected to shape processing by laser treatment or erosion. Further, protective films for the flexible circuit substrates can also be directly applied so long as materials on the back side surface of the bump contacts comprise elastic materials having a sufficient thickness.

All the conventional forming techniques can be used as methods for separately forming the elastic materials. The elastic materials may be joined to the substrates either by permanent adhesive fixing using adhesives or melt adhesion, or by only overlapping of the elastic materials on the substrates.

The pressurizing means 6a and 6b may be any means so long as they can uniformly apply the pressure F to all the respective connections of the bump contacts 2 and the portions 5 to be contacted. For example, a structure having a pair of parallel flat surfaces facing each other is the easiest and most effective structure. In addition, the pressurizing means may have a structure having projections such that concentrated loads can be applied to each of the connecting positions of the bump contacts 2 and the portions 5 to be contacted.

The pressurizing sources may be transmitting media of compressing force obtained from power sources, such as high-pressure air and actuators. The compressing force may be maintained keeping the elastic materials in a deformed state by caulking or molding.

Examples of the practical pressurizing means include a pressurizing structure comprising a stationary base and an inspection head (which can be repeatedly opened and closed) of an inspection instrument in inspection stages, etc., and when used in products, include various housings, cases and covers.

Figure 3A:
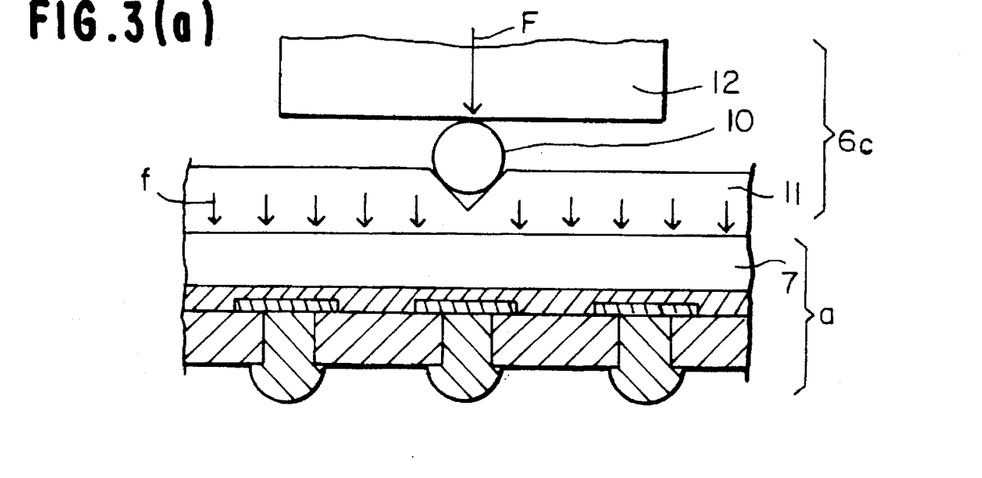
FIG. 3 is a schematic view showing structural examples of pressurizing means suitable for a connecting structure of the invention.

Further preferred embodiments of the above-described pressurizing means are explained by reference to the following examples. FIG. 3 is a schematic view showing structural examples of pressurizing means suitable for the connecting structures of the present invention. Referring to FIG. 3(a), 6c is a structure on at least one side of the pressurizing means facing each other, which comprises a pressure carrier portion 10 collectively receiving pressure F from a pressurizing source 12 at one portion or predetermined plural portions, and a transmitting portion 11 for transmitting the pressure F collectively received by the pressure carrier portion 10 as pressure F uniformly dispersed to all the respective contacts of the bump contacts and the portions to be contacted. FIG. 3(a) shows an example in which a ball is used as the pressure carrier portion and received in a V-shaped groove, a conical recess or a spherical recess. This structure is excellent in uniform pressure distribution.

Figure 3B:
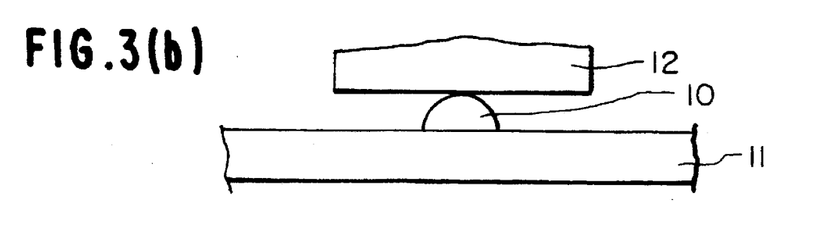
Figures 3C, 3D:
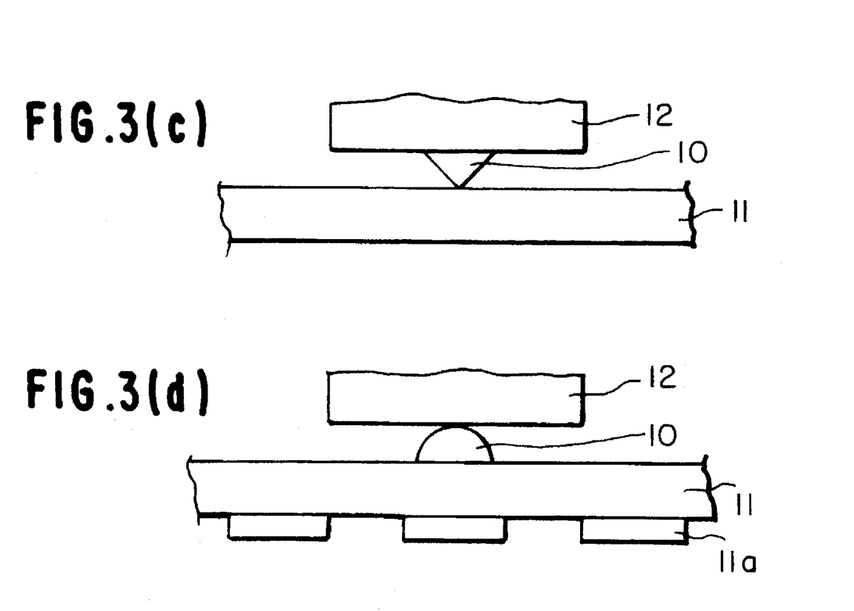

Other embodiments of the pressure distribution structures as described above are shown in FIGS. 3(b) to 3(d). FIG. 3(b) is a schematic view showing an example in which a projection 10 having an arbitrary shape such as a semispherical shape is integrated with a transmitting portion 11. Further, FIG. 3(c) is a schematic view showing an example in which a projection 10 having an arbitrary shape is integrated with a pressurizing source 12. These embodiments are somewhat inferior to the embodiment shown in FIG. 3(a) in uniform pressure distribution, but are superior in cost. FIG. 3(d) is a schematic view showing a structural example in which a transmitting portion 11 has projections 11a which can distribute concentrated load to specified bump contacts. This can distribute the pressure to all the bump contacts with little loss.

The structure as described above may be any structure, for example, a structure made up of a plurality of parts, so long as it collectively receives localized pressure at one point or a plurality of points if necessary, and uniformly distributes the concentrated pressure to the predetermined bump positions.

The contact objects b may be any material of from minute objects to large-sized objects of product levels, such as LSIs of bare chip levels, TAB films to which the bare chips are connected, multichips obtained by integration thereof, various electronic parts, circuit substrates on which the electronic parts are mounted in large numbers and objects similar to the flexible circuit substrates a. Contacts and electrically conductive portions formed on these surfaces are used as the portions to be contacted for connection in the present invention.

The connecting methods of the present invention are used in various states, for example, from brief contact as in probes or relay contacts to permanent fixing in contacted and pressed states as finished products or melt fixing after contact.

CONTACT RELIABILITY CONFIRMATION EXPERIMENT 1

In this experiment, a conventional flexible circuit substrate having bump contacts was provided with an elastic material, and the resulting product was laminated with a copper plate. Pressure was uniformly applied from the outside of the layer such that the bump contacts are contacted with the copper plate, and the contact state of the respective bump contacts with the copper plate was observed, thereby examining the contact reliability of the connecting structure of the present invention.

Figure 4:
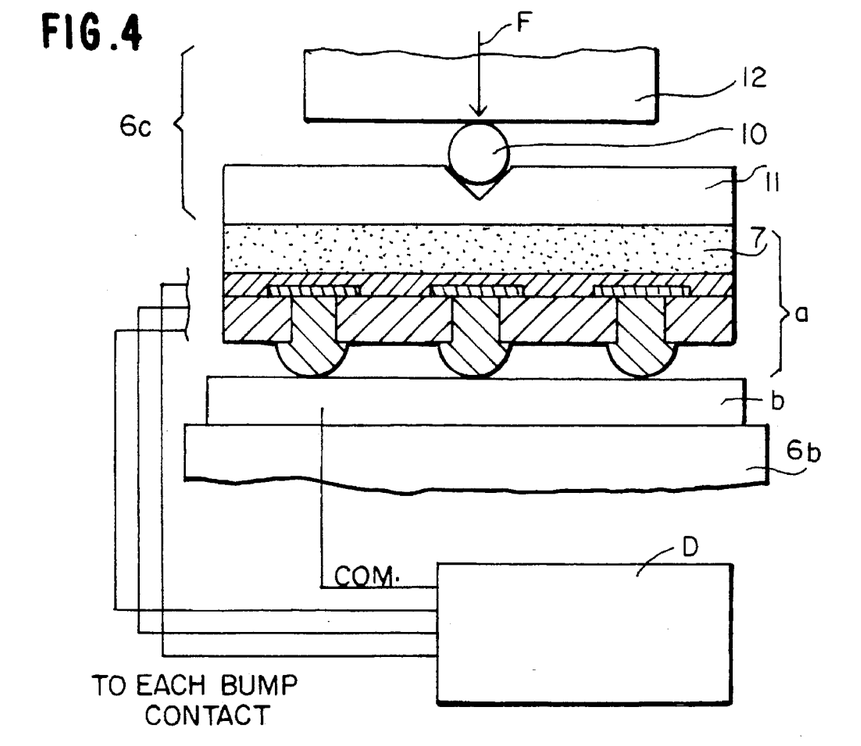
FIG. 4 is a schematic view showing a structure of contact reliability-confirming experiment 1.

FIG. 4 is a schematic view showing a constitution of this experiment. In the flexible circuit substrate a having the bump contacts used in this experiment, 400 nickel bump contacts 2 having a height of 15 gm were formed on a 25 lim thick polyimide insulating film 1 in total at 100 um spacings so as to form four sides of a 10 mm square (so that 101 bump contacts per side form a line, sharing the bump contact at an apex of the square), and electrically connect to circuit patterns 3 on the back side, respectively.

The elastic material 7 used was a 0.3 mm thick plate as shown in FIG. 2(a), the plate being formed of silicone rubber having a Shore hardness of A40, and joined to the substrate only by overlapping without fixing by adhesion. A pressurizing means 6c with which the pressure was uniformly dispersible as shown in FIG. 3(a) was mounted on the bump contact side of a compression tester which could arbitrarily set the pressure. The above-described conventional flexible circuit substrate a having the bump contacts was laminated with a copper plate b, and the elastic material and the pressurizing means were added thereto to constitute the connecting structure as shown in FIG. 4.

The circuit patterns 3 electrically connecting to the respective bump contacts were connected to a measuring instrument D to make it possible to confirm the contact state of all the respective bump contacts with the copper plate.

As a result of the above experiment, it was confirmed that all the bump contacts were satisfactorily contacted with the copper plate by a pressure of 4 g per bump contact including the weight of the connecting structure itself. This proved that the connecting method and the connecting structure of the present invention had high contact reliability and were useful for repeated contact of process inspections, etc.

COMPARATIVE EXPERIMENT 1

A contact test was conducted in the same manner as in Experiment 1 above except that the elastic material 7 and the pressurizing means 6c were removed. As a result, 80 to 120/400 poor contacts were confirmed at the same pressure as in the above experiment, which markedly showed the conventional problem.

CONTACT RELIABILITY CONFIRMATION EXPERIMENT 2

In this experiment, LSI pads in a bare chip state were corresponded to bump contacts on a flexible circuit substrate, and pressure was uniformly applied from the outside of the layer so as to contact with each other. The contact state of the respective bump contacts with the LSI pads was observed, thereby examining the usefulness of mounting of the connecting structure of the present invention.

Figure 5:
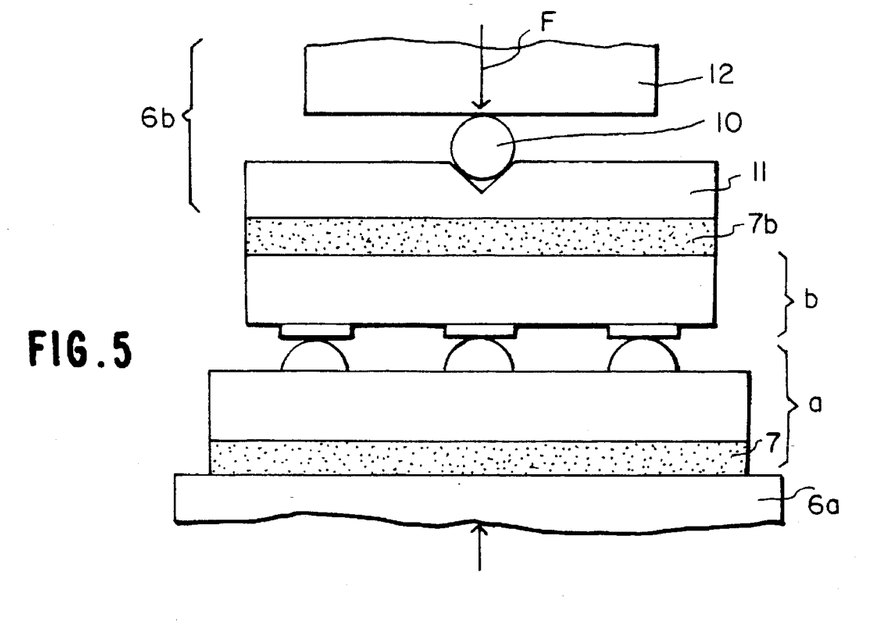
FIG. 5 is a schematic view showing a structure of contact reliability-confirming experiment 2.

FIG. 5 is a schematic view showing a constitution of this experiment. As shown in FIG. 5, the flexible circuit substrate a with the bump contacts having an elastic sheet 7 was mounted on a housing which is one pressurizing means 6a, and the LSI bare chip was used as a contact object b. The substrate a and the LSI bare chip b were overlapped with each other such that the pads 5 corresponded to the bump contacts 2, and the back surface of the LSI bare chip was also overlapped with an elastic sheet 7b. Pressure was then applied by the other pressurizing means 6b.

Similar to Experiment 1, plates formed of silicone rubber were used as the elastic sheet 7 and 7b, junction was conducted only by overlapping without fixing by adhesion, and the pressurizing means 6b had the structure of the pressurizing means 6c as shown in FIG. 3(a).

As a result of the above experiment, it was confirmed that all the LSI pads were contacted with the bump contacts on the flexible circuit substrate, providing satisfactory mounting. This proved that the connecting method and the connecting structure of the present invention were useful for mounting of parts.

COMPARATIVE EXPERIMENT 2

A contact test was conducted in the same manner as in Experiment 2 above except that the elastic material 7 and the pressurizing means 6c were removed. As a result, a large number of poor contacts were confirmed at the same pressure as in the above experiment, which markedly showed the problem on mounting.

As described above, according to the present invention, it becomes possible to contact all the bump contacts on the flexible circuit substrate with the portions to be contacted on the contact object, the portions being formed minutely and densely as LSIs of bare chip levels. The connecting structure having high contact reliability to process inspections of small-sized electronic instrument products and connected portions themselves in the products can be provided.

While the invention has been described in detail and with reference to specific embodiments thereof, it will be apparent to one skilled in the art that various changes and modifications can be made therein without departing from the spirit and scope thereof.

What is claimed is:

1. A method for connecting a flexible circuit substrate to a contact object, which comprises laminating the flexible circuit substrate having a plurality of bump contacts in which the plural bump contacts mounted on one surface of an insulating film are electrically connected to circuit patterns provided on either surface of said film or inside said films and an elastic material is mounted in a position corresponding to the back side of the bump contact, with the contact object having a plurality of portions to be contacted such that said plural bump contacts face to said plural portions to be contacted at a joined surface, corresponding to each other, to form a laminate, and applying pressure to the entire surface of said laminate in a compressing direction to contact said plural bump contacts with the plural portions to be contacted.

2. The method as claimed in claim 1, wherein at least one of the pressurizing means contacting the laminate collectively receives pressure from a pressurizing source at a pressure carrier portion, and transmits the pressure to the respective contacts of the bump contacts and the portions to be contacted through a transmitting portion.

3. The method as claimed in claim 1, wherein the elastic material is mounted in a position corresponding to the back side of the portion to be contacted of the contact object so as to intervene said elastic material between the portion to be contacted and the pressurizing means on the side of said portion to be contacted.

4. A connecting structure of a flexible circuit substrate and a contact object, which comprises a laminate in which the flexible circuit substrate having a plurality of bump contacts is laminated with the contact object having a plurality of portions to be contacted such that said plural bump contacts face to said plural portions to be contacted at a joined surface, corresponding to each other in said flexible circuit substrate, the plural bump contacts mounted on one surface of an insulating film being electrically connected to circuit patterns and an elastic material being mounted in a position corresponding to a back side of the bump contact, and pressurizing means provided so as to pinch said laminate, thereby applying pressure to the entire surface of said laminate in a compressing direction to contact said plural bump contacts with the plural portions to be contacted.

5. The connecting structure as claimed in claim 4, wherein at least one of the pressurizing means pinching the laminate comprises a pressure carrier portion for collectively receiving pressure from a pressurizing source, and a transmitting portion for transmitting pressure received by said pressure carrier portion to the respective contacts of the bump contacts and the portions to be contacted.

6. The connecting structure as claimed in claim 4, wherein the elastic material is mounted in a position corresponding to the back side of the portion to be contacted of the contact object so as to intervene said elastic material between the portion to be contacted and the pressurizing means on the side of said portion to be contacted.

* * * * *